Figure 1:
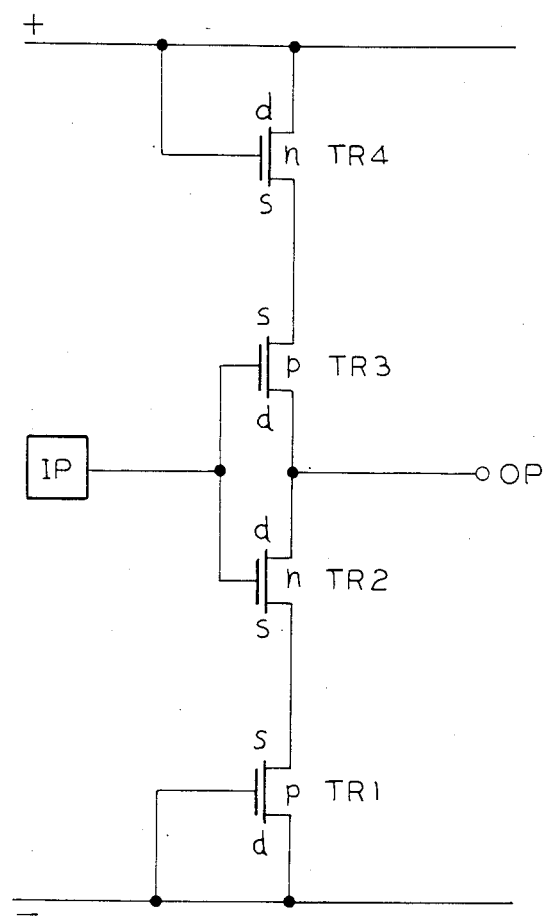

United States Patent [19]
Magee

[11] Patent Number: 4,578,600
[45] Date of Patent: Mar. 25, 1986

[54] CMOS BUFFER CIRCUIT

[75] Inventor: Terence E. Magee, Fulbourn, England

[73] Assignee: ITT Industries, Inc., New York, N.Y.

[21] Appl. No.: 460,953

[22] Filed: Jan. 25, 1983

[30] Foreign Application Priority Data

Jan. 26, 1982 [GB] United Kingdom ............... 8202151

[51] Int. Cl.⁴ ................. H03K 19/094; H03K 17/687
[52] U.S. Cl. ................................. 307/451; 307/579; 307/585; 307/290; 307/270
[58] Field of Search .............. 307/451, 452, 469, 576, 307/585, 579, 313, 288, 304, 453, 290, 270, 605, 291

[56] References Cited

U.S. PATENT DOCUMENTS

| | | | |
|---|---|---|---|
| 3,873,856 | 3/1975 | Gerlach et al. | 307/290 X |
| 4,023,122 | 5/1977 | Oura | 307/581 X |
| 4,122,360 | 10/1978 | Kawagai et al. | 307/452 |
| 4,297,596 | 10/1981 | Eckert | 307/290 X |
| 4,459,494 | 7/1984 | Takakura | 307/290 |
| 4,464,587 | 8/1984 | Suzuki et al. | 307/290 X |
| 4,475,050 | 10/1984 | Noufer | 307/579 X |

Primary Examiner—Stanley D. Miller
Assistant Examiner—David R. Bertelson
Attorney, Agent, or Firm—Donald J. Lenkszus

[57] ABSTRACT

A CMOS logic input circuit comprises two complementary transistor pairs, TR1 and TR2; TR3 and TR4 coupled in series between the supply rails. The gates of n-channel transistor TR4 and p-channel transistor TR1 are coupled to the positive and negative supply rails respectively. A switching function is performed by TR2 and TR3.

The arrangement is such that the switching threshold is substantially independent of transistor characteristics.

1 Claim, 2 Drawing Figures

CMOS BUFFER CIRCUIT

This invention relates to integrated circuits, and in particular to input arrangements for complementary metal-oxide-silicon (CMOS) logic circuits.

CMOS integrated logic circuits are employed in a wide variety of applications where their low power consumption confers a distinct advantage over other logic families. One of the problems associated with all CMOS input circuit designs is that of achieving the desired tolerance on its switching threshold voltage, e.g. to render the circuit TTL compatible, despite the unrelated production spreads of P and N channel transistor characteristics. Where a CMOS circuit is produced in large volume by a single manufacturer this does not constitute an insoluble problem as the mask designs can be matched to typical device parameters and strict process controls can be applied. Where, however, a circuit is to be made in small volume by a variety of manufacturers all of whom employ slightly different processing techniques it has previously been necessary, to obtain electrical uniformity of the finished circuits, to design a mask set for each manufacturer. This is an extremely expensive procedure and inevitably results in a high unit cost for the finished circuit.

The object of the invention is to minimize or to overcome this disadvantage.

According to the invention there is provided a complementary metal-oxide-silicon (CMOS) logic input circuit, including a binary switch element, and bias means associated with the switch element whereby, in use, the element is biased from the positive and negative circuit supply terminals by respective upper and lower voltages, the arrangement being such that the input threshold switching level of the switch element is substantially independent of CMOS device characteristic tolerances.

The arrangement adds an offset to the N channel device equal to a P channel transistor threshold and vice versa to ensure that both transistors require the same gate voltage (equal to the sum of an N channel threshold voltage plus a P channel threshold voltage) to turn them on. Thus if the N and P channel devices are designed to have sizes in inverse ratio to the channel mobilities, the net circuit output current will be zero when the input voltage is equal to half the supply voltage and thus the logic threshold is stabilized at this level. The logic switching threshold can be fixed at a voltage anywhere between the sum of the N and P device threshold and the supply minus the sum of these thresholds, by scaling the sizes of transistors TR1 and TR2 with respect to transistors TR3 and TR4. The compensation provided by this circuit is however only perfect for logic threshold fixed at half the supply voltage, but is still better than the ratioed two transistor CMOS approach for voltages significantly different from this level.

It will of course be understood that the term CMOS as employed herein includes both silicon gate and metal gate constructions although for most applications we prefer to employ silicon gate techniques.

Figure 2:
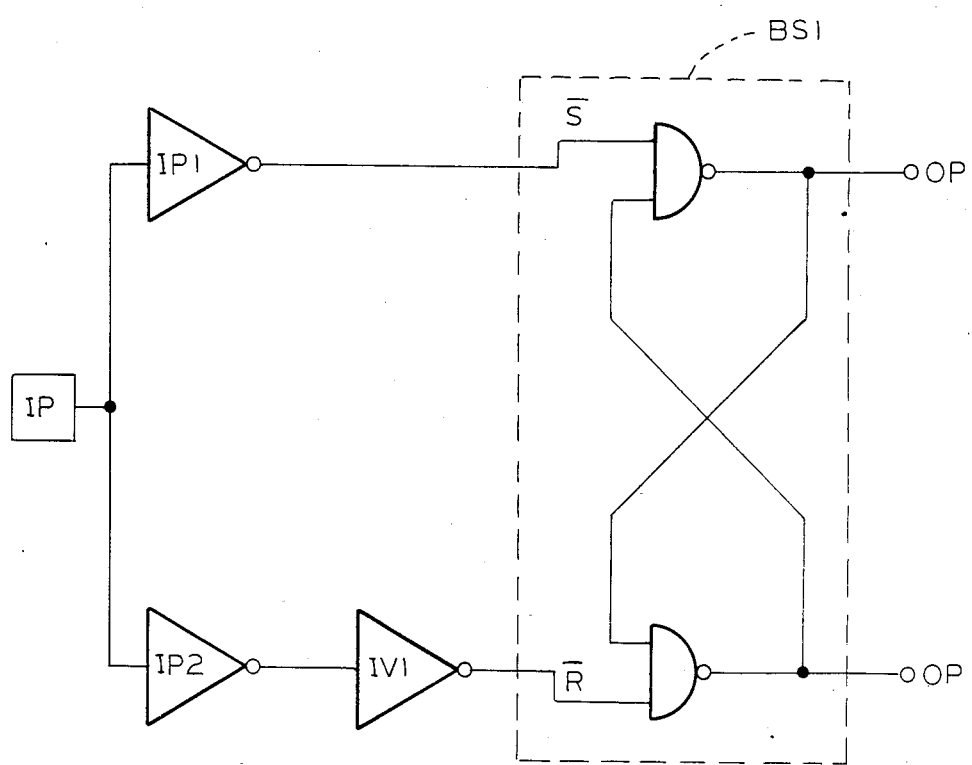

An embodiment of the invention will now be described with reference to the accompanying drawing in which FIG. 1 illustrates a CMOS logic input circuit; and FIG. 2 shows a Schmidt trigger arrangement employing the circuit of FIG. 1.

Referring to FIG. 1, the circuit comprises two series connected complementary transistor pairs, TR1 to TR4, coupled between the positive and negative circuit rails. The gate of the p-channel transistor TR1 is coupled to the negative rail and that of n-channel transistor TR4 to the positive rail. These two transistors are thus maintained in a conductive state, the voltage drop across each being equal to its characteristic threshold voltage, plus the effective gate drive voltage required to support the drain current flowing.

Switching is performed by the transistors TR2 and TR3 to whose gates input signals are coupled. For the switching threshold to occur e.g. at half the supply voltage $V_T$ (TR1)+Veff (TR1)+$V_T$ (TR2)+Veff (TR2) must equal $V_T$ (TR3)+Veff (TR3)+$V_T$ (TR4)+Veff (TR4) where $V_T$ is the threshold voltage of the identified transistor and Veff is its effective gate drive voltage. Since all N channel and all P channel transistor thresholds track, this requirement reduces to Veff (TR1)+Veff (TR2)=Veff (TR3)+Veff (TR4). Also since the same current flows in all transistors at the switching threshold and since this current is proportional to (Veff×W/L, where W and L are the effective width and length respectively of the transistor concerned, this condition can be met by designing the size of TR1 to be equal to that of TR3 and the size of TR2 to be equal to that of TR4.

Furthermore, at the threshold, TR1 in series with TR2 can be considered as the lower limb of a potential divider across the supply (less the same offset voltage at each end), with TR3 in series with TR4 as the top limb. The switching threshold voltage can thus be reduced (increased) by reducing (increasing) Veff (TR1)+Veff (TR2) and increasing (reducing) Veff (TR3)+Veff (TR4), by altering the W/L ratio of TR1/TR2 to TR3/TR4. Optimum compensation for production spread of characteristics, with thresholds different from half the supply voltage only occures if TR1 drops the same voltage as TR2 and TR3 drops the same voltage as TR4 at the switching thresholds. Thus P to N channel W/L ratios must remain in inverse ratio to their mobilities, at the W/L ratios of the top pair of transistors to bottom pair of transistor is varied to alter the switching threshold.

An example of the use of the technique in the construction of a Schmidt trigger circuit is shown in FIG. 2. In this arrangement two complete input circuits of the type described above are used. One (IP1) is designed to have a high level switching threshold V1 and the other (IP2) to have a low level threshold V2. Both are supplied with the same input. When this input goes above the high threshold level IP1 sets an R-S flip flop BS1. When the input signal goes below the low threshold level IP2 resets the R-S flip flop. The flip flop output thus follows the input, but with Schmidt trigger hysterisis.

It will be appreciated that although the circuit arrangements described herein can be realized with discrete devices they will normally comprise or be incorporated in an integrated circuit.

What is claimed is:

1. A complementary metal-oxide-silicon (CMOS) logic input circuit, including first and second complementary pairs of n-channel and p-channel transistors series coupled between the positive and negative supply terminals of the circuit, wherein the gate and drain of the n-channel transistor of the first pair and the p-channel transistor of the second pair are coupled respectively to the positive and negative terminals, wherein the circuit input is coupled to the gates of the other n-channel and p-channel transistors and the circuit output is coupled to the drains of the other n-channel and p-channel transistors, and wherein the arrangement is such that, in use, the other transistors are so biased for the positive and negative supply terminals that their input threshold switching level is substantially independent of CMOS device characteristic tolerances.

* * * * *